United States Patent
Kim

(10) Patent No.: US 8,519,418 B2
(45) Date of Patent: Aug. 27, 2013

(54) LIGHT EMITTING DEVICE PACKAGE HAVING DIELECTRIC PATTERN ON REFLECTIVE LAYER

(75) Inventor: Sun Kyung Kim, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 13/020,038

(22) Filed: Feb. 3, 2011

(65) Prior Publication Data

US 2011/0186894 A1 Aug. 4, 2011

(30) Foreign Application Priority Data

Feb. 4, 2010 (KR) .................. 10-2010-0010351

(51) Int. Cl.
- H01L 33/00 (2010.01)
- F21V 7/00 (2006.01)
- F21V 5/00 (2006.01)
- F21V 1/00 (2006.01)
- F21V 7/04 (2006.01)

(52) U.S. Cl.
USPC ........ 257/98; 257/99; 257/100; 257/E33.059; 257/E33.061; 257/E33.068; 362/215; 362/217.05; 362/560; 362/612

(58) Field of Classification Search
None
See application file for complete search history.

(56) References Cited

U.S. PATENT DOCUMENTS

| | | | |
|---|---|---|---|
| 6,441,943 B1 * | 8/2002 | Roberts et al. | 359/267 |
| 7,828,460 B2 * | 11/2010 | Van De Ven et al. | 362/231 |
| 2003/0067264 A1 * | 4/2003 | Takekuma | 313/501 |
| 2004/0173808 A1 | 9/2004 | Wu | |
| 2007/0001187 A1 * | 1/2007 | Kim | 257/98 |
| 2007/0247855 A1 | 10/2007 | Yano | |
| 2008/0224160 A1 * | 9/2008 | Chang et al. | 257/98 |
| 2010/0053930 A1 | 3/2010 | Kim et al. | |
| 2011/0215353 A1 * | 9/2011 | Won et al. | 257/98 |

FOREIGN PATENT DOCUMENTS

| | | |
|---|---|---|
| JP | 2007-019505 A | 1/2007 |
| JP | 2007-266358 A | 10/2007 |
| KR | 10-2004-0073869 A | 8/2004 |
| KR | 10-2006-0126115 A | 12/2006 |
| KR | 10-2007-0089784 A | 9/2007 |
| KR | 10-2008-0058645 A | 6/2008 |
| KR | 10-0869530 B1 | 11/2008 |
| KR | 10-2010-0027891 A | 3/2010 |
| WO | WO 2007/123938 A2 | 11/2007 |
| WO | WO 2009/028807 A2 * | 3/2009 |
| WO | WO 2009/028807 * | 5/2009 |

OTHER PUBLICATIONS period. (n. d.) The American Heritage® Dictionary of the English Language, Fourth Edition. (2003). Retrieved Feb. 3, 2012 from http://www.thefreedictionary.com/period.*
Machine translation of Korean Patent Publication No. KR20080058645 to Dong-Seol Kim (2008), pp. 1-11.*

* cited by examiner

*Primary Examiner* — Michael Jung

(74) *Attorney, Agent, or Firm* — Birch, Stewart, Kolasch & Birch, LLP

(57) ABSTRACT

Disclosed are a light emitting device package and a lighting system. The light emitting device package includes a submount including a cavity, a light emitting device chip provided in the cavity, an electrode electrically connected to the light emitting chip, a reflective layer formed on a surface of the cavity, a dielectric pattern on the reflective layer, and an encapsulant filled in the cavity.

5 Claims, 5 Drawing Sheets

LIGHT EMITTING DEVICE PACKAGE HAVING DIELECTRIC PATTERN ON REFLECTIVE LAYER

CROSS-REFERENCE TO RELATED APPLICATION

This application claims priority of Korean Patent Application No. 10-2010-0010351 Filed Feb. 4, 2010, which is hereby incorporated by reference.

BACKGROUND

The embodiment relates to a light emitting device package and a lighting system.

A light emitting device (LED) includes a p-n junction diode having a characteristic of converting electric energy into light energy. The p-n junction diode can be formed by combining group III-V elements of the periodic table. The LED can represent various colors by adjusting the compositional ratio of compound semiconductors.

When forward voltage is applied to the LED, electrons of an n layer are combined with holes of a p layer, so that energy corresponding to an energy gap between a conduction band and a valance band may be generated. This energy is realized as heat or light, and the LED emits the energy in the form of light.

In order to improve the quantity of light of the LED, the efficiency of an LED chip must be increased, and the damage of a package surrounding a chip must be reduced.

Accordingly, the lateral surface and the bottom surface of the package may include a reflective layer (mirror) including Ag-based materials having high reflectance.

However, according to the related art, a flat mirror reflects light only in an original direction, and does not diffuse or diffract light. Accordingly, the flat mirror cannot be used to extract light at the boundary surface between an encapsulant and the air.

In addition, according to the related art, in order to maintain the reflectance of the reflective layer, a capping layer must be coated. However, the reflectance of the capping layer is exponentially inverse-proportion to the thickness of the capping layer.

BRIEF SUMMARY

The embodiment provides a light emitting device package and a lighting system capable of diffracting or diffusing light while maintaining the reflectance thereof.

The light emitting device package includes a sub-mount including a cavity, a light emitting device chip provided in the cavity, an electrode electrically connected to the light emitting chip, a reflective layer formed on a surface of the cavity, a dielectric pattern on the reflective layer, and an encapsulant filled in the cavity.

According to the embodiment, the light emitting device package includes a sub-mount including a cavity, a light emitting device chip provided in the cavity, an electrode electrically connected to the light emitting chip, a reflective layer formed on a surface of the cavity, a second dielectric layer on the reflective layer, and an encapsulant filled in the cavity.

According to the embodiment, a lighting system includes a substrate, and a light emitting module including a light emitting device package mounted on the substrate.

DETAILED DESCRIPTION OF THE EMBODIMENTS

Hereinafter, a light emitting device package and a lighting system according to the embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiment)

Figure 1:
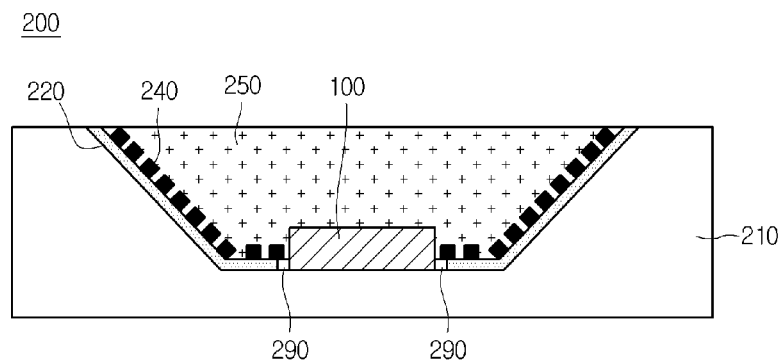
FIG. 1 is a sectional view showing a light emitting device package according to a first embodiment.

FIG. 1 is a sectional view showing a light emitting device package 200 according to the first embodiment.

The light emitting device package 200 according to the first embodiment may include a sub-mount 210 containing a cavity C, a light emitting device chip 100 formed on the sub-mount 210, a reflective layer 220 formed on a lateral surface of the cavity C, a dielectric pattern 240 formed on the reflective layer 220, and an encapsulant 250 filled in the cavity C.

The dielectric pattern 240 may have a refractive index different from that of the encapsulant 250. For example, the dielectric pattern 240 may have a refractive index greater than or less than that of the encapsulant 250. As the difference in the refractive index between the encapsulant 250 and the dielectric pattern 240 is increased, the diffusion of light at the dielectric pattern 240 is increased. Therefore, the probability, in which light is re-introduced due to the total reflection occurring at the boundary surface between the air and the encapsulant 250, can be lowered, so that final light extraction efficiency can be improved.

For example, if the encapsulant 250 may include a silicon (Si) gel, the dielectric pattern 240 may have the refractive index of about 1.4 or less, or may have the refractive index of about 1.4 or more, but the embodiment is not limited thereto.

The dielectric pattern 240 may have a pattern period of about 50 nm to about 3000 nm to diffract or diffuse the light.

The dielectric pattern 240 may include at least one of oxide, nitride, and fluoride-based dielectric substances, but the embodiment is not limited thereto.

The encapsulant 250 may include luminescence material, but the embodiment is not limited thereto. For example, although blue, green, and UV light emitting devices do not require luminescence material, a white light emitting device may include an encapsulant containing luminescence material.

Meanwhile, if the luminescence material is required, a luminescence material layer may be formed on the light emitting device chip 100 in a chip process before a package process is performed. For example, the light emitting device chip 100 may be provided thereon with a luminescence material layer (not shown) having a uniform thickness through a conformal coating process. The light emitting device chip 100 having the luminescence material layer may be attached to the sub-mount 210 through the package process.

According to the embodiment, an insulating layer 290 including an oxide layer or a nitride layer may be interposed between the reflective layer 220 and the light emitting chip 100, thereby preventing the reflective layer 220 from being electrically shorted with the light emitting device chip 100. The insulating layer 290 may be formed higher than the reflective layer 220, and may be interposed between the dielectric pattern 240 and the light emitting device chip 100, but the embodiment is not limited thereto.

Figure 6:
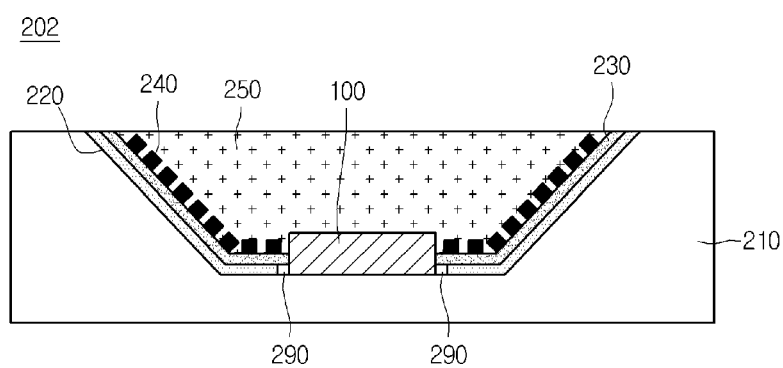
FIG. 6 is a sectional view showing a light emitting device package according to a second embodiment.

FIG. 6 is a sectional view showing a light emitting device package 202 according to a second embodiment.

Figure 5:
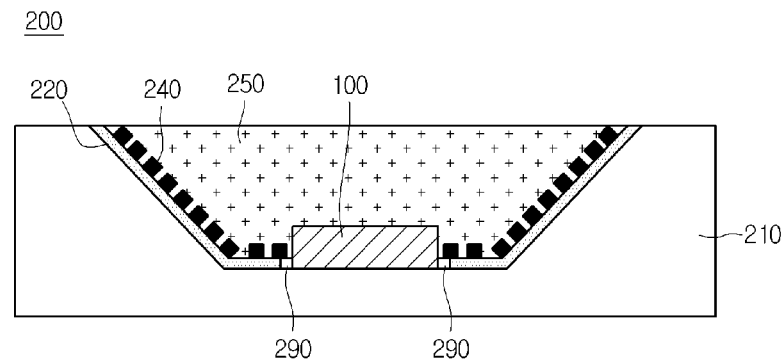

According to the second embodiment, similarly to the light emitting device package 200 of FIG. 5, the light emitting device package 202 may include a second dielectric layer 230 formed on the reflective layer 220 and the dielectric pattern 240 may be formed on the second dielectric layer 230, so that the diffraction of the light of the dielectric pattern 240 can be increased and the reflective layer 220 can be prevented from being oxidized.

According to the light emitting device package according to the embodiment, the reflective layer 220 including the dielectric pattern 240 may be introduced into the LED package, so that the reflective layer 220 can diffuse light while maintaining the intrinsic refractive thereof. Accordingly, the probability, in which light is re-introduced due to the total reflection occurring at the boundary surface between the air and the encapsulant 250, can be lowered so that final light extraction efficiency can be improved.

Hereinafter, the method of manufacturing the light emitting device package 200 according to the first embodiment will be described with reference to FIGS. 2 to 5. According to the method of manufacturing the light emitting device package 200, the sequence of the process steps thereof is restricted, and may be deployed differently from the sequence of the process steps to be described below.

Figure 2:
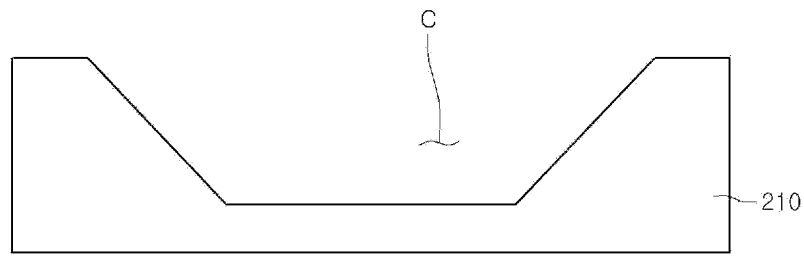
FIGS. 2 to 5 are sectional views showing the manufacturing process of the light emitting device package according to the first embodiment.

As shown in FIG. 2, after preparing the sub-mount 210, the cavity C may be formed by removing a part of the sub-mount 210. The sub-mount 210 may be subject to an isolation process.

The sub-mount 210 may include material having a thermal expansion coefficient approximating that of the material of the light emitting chip and superior thermal conductivity. For example, the sub-mount 210 may include silicon material, synthetic resin material, or metal material. For example, the sub-mount 210 may include Si, but the embodiment is not limited thereto. The sub-mount 210 may include a PCB or low temperature co-fired (LTCC).

Figure 3:
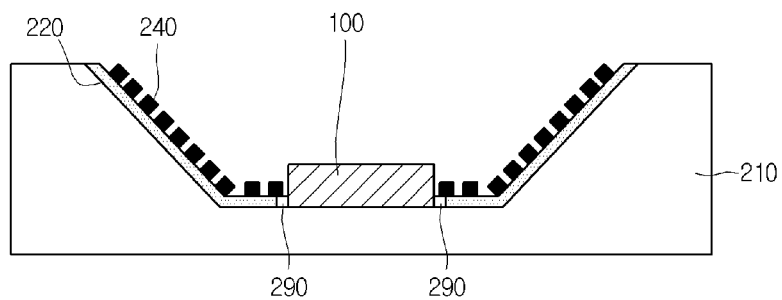

Next, as shown in FIG. 3, first and second electrode layers (not shown) may be formed on the sub-mount 210. The first and second electrode layers are electrically isolated from each other to supply power to the light emitting device chip 100 and dissipate heat emitted from the light emitting device chip 100 to the outside. In addition, the sub-mount 210 may be provided therein with a device to prevent ESD in the form of a zener diode, but the embodiment is not limited thereto.

In addition, the first and second electrode layers may be formed on a bottom surface of the sub-mount 210. In this case, the first and second electrode layers may be electrically connected to the light emitting device chip 100 through via hole.

The reflective layer 220 may be formed on the lateral surface of the cavity C of the sub-mount 210. The reflective layer 220 may be formed by coating Ag or Ag-based compounds having high reflectance, but the embodiment is not limited thereto.

Subsequently, the dielectric pattern 240 may be formed on the reflective layer 220.

For example, in order to form the dielectric pattern 240, a first dielectric layer (not shown) may be formed on the reflective layer 220. Thereafter, the dielectric pattern 240 may be formed by performing a dry etching process or a wet etching process with respect to the first dielectric layer, but the embodiment is not limited thereto.

In addition, in order to form the dielectric pattern 240, a mask pattern (not shown) may be formed on the reflective layer 220. Then, after forming the dielectric pattern 240 on the reflective layer 220 in the mask pattern, the mask pattern may be lifted off.

The dielectric pattern 240 has a pattern period of about 50 nm to about 3000 nm to diffract or diffuse the light.

The dielectric pattern 240 may include at least one of oxide, nitride, and fluoride-based dielectric substances, but the embodiment is not limited thereto.

According to the light emitting device package according to the embodiment, the reflective layer 220 including the dielectric pattern 240 may be introduced into the LED package, so that the reflective layer 220 can diffuse light while maintaining the intrinsic refractive thereof. Accordingly, the probability, in which light is re-introduced due to the total reflection occurring at the boundary surface between the air and the encapsulant 250, can be lowered so that final light extraction efficiency can be improved.

Next, the light emitting device chip 100 may be attached on the sub-mount 210.

Figure 4:
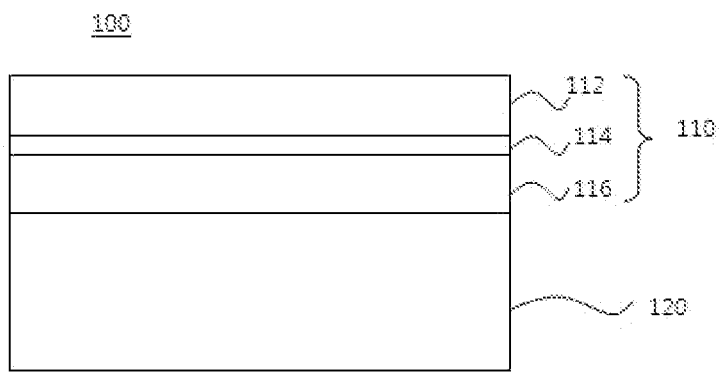

FIG. 4 is an enlarged view showing the light emitting device chip 100 according to the embodiment.

The light emitting device chip 100 may include material selected from the group consisting of GaN, GaAs, GaAsP, and GaP. For example, the light emitting device chip 100 may include GaN, InGaN, InGaAlP, or AlGaAs, but the embodiment is not limited thereto.

The light emitting device chip 100 may be a vertical type light emitting chip, but the embodiment is not limited thereto. In other words, the light emitting device chip 100 may be a lateral type chip or a flip chip. The light emitting device chip 100 may include a light emitting structure 110 including a second conductive semiconductor layer 116, an active layer 114, and a first conductive semiconductor layer 112.

Hereinafter, the manufacturing process of the light emitting device chip 100 will be described with reference to FIG. 4.

First, a first substrate (not shown) is prepared. The first substrate may include a conductive substrate or an insulating substrate. For example, the first substrate may include at least one selected from the group consisting of sapphire ($Al_2O_3$), SiC, Si, GaAs, GaN, ZnO, Si, GaP, InP, Ge, and $Ga_2O_3$. A concavo-convex structure may be formed on the first substrate, but the embodiment is not limited thereto.

The impurities existing on the surface of the first substrate may be removed through a wet cleaning process.

Thereafter, the light emitting structure 110 including the second conductive semiconductor layer 116, the active layer 114, and the first conductive semiconductor layer 112 may be formed on the first substrate.

The first conductive semiconductor layer 112 may include group III to V compound semiconductors doped with the first conductive dopants. If the first conductive semiconductor layer 112 is an N type semiconductor, the first conductive dopant may include Si, Ge, Sn, Se, or Te as an N type dopant, but the embodiment is not limited thereto.

The first conductive semiconductor layer 112 may include semiconductor material having a compositional formula of $In_xAl_yGa_{1-x-y}N$ ($0 \leq x \leq 1$, $0 \leq y \leq 1$, $0 \leq x+y \leq 1$).

The first conductive semiconductor layer 112 may include at least one selected from the group consisting of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 112 may include an N type GaN layer, which is formed through the CVD, MBE, sputtering or HVPE. In addition, the first conductive semiconductor layer 112 can be formed by injecting trimethyl gallium (TMGa) gas, ammonia ($NH_3$) gas, nitrogen ($N_2$) gas and silane ($SiH_4$) gas including n type impurities, such as silicon, into the chamber. The active layer 114 emits the light having energy determined based on the intrinsic energy band of the active layer (light emitting layer) 114 through the recombination of electrons injected through the first conductive semiconductor layer 112 and holes injected through the second conductive semiconductor layer 116.

The active layer 114 may include at least one of a single quantum well structure, a multiple quantum well (MQW) structure, a quantum wire structure or a quantum dot structure. For instance, the active layer 114 can be prepared as the MQW structure by injecting TMGa gas, $NH_3$ gas, $N_2$ gas, and trimethyl indium (TMIn) gas, but the embodiment is not limited thereto.

The active layer 114 may have a pair structure of well/barrier layers including at least one of InGaN/GaN, InGaN/InGaN, GaN/AlGaN, InAlGaN/GaN, GaAs(InGaAs), AlGaAs, and GaP(InGaP)/AlGaP, but the embodiment is not limited thereto. The well layer may include a material having the bandgap lower than that of the barrier layer.

A conductive clad layer (not shown) can be formed on and/or under the active layer 114. The conductive clad layer may include an AlGaN-based semiconductor having the bandgap higher than that of the active layer 220.

The second conductive semiconductor layer 116 may include the group III-V compound semiconductor doped with the second conductive dopant. For instance, the second conductive semiconductor layer 116 may include the semiconductor material having the compositional formula of $In_xAl_yGa_{1-x-y}N$ ($0 \leq x \leq 1$, $0 \leq y \leq 1$, $0 \leq x+y \leq 1$). In detail, the second conductive semiconductor layer 116 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 116 is a P type semiconductor layer, the second conductive dopant includes the P type dopant such as Mg, Zn, Ca, Sr, or Ba. The second conductive semiconductor layer 116 can be prepared as a single layer or a multiple layer, but the embodiment is not limited thereto.

The second conductive semiconductor layer 116 may include a p type GaN layer, which can be formed by injecting TMGa gas, $NH_3$ gas, $N_2$ gas and $(EtCp_2Mg)\{Mg(C_2H_5C_5H_4)_2\}$ gas including p type impurities (for example, Mg) into the chamber, but the embodiment is not limited thereto.

According to the embodiment, the first conductive semiconductor layer 112 may include an N type semiconductor layer and the second conductive semiconductor layer 116 may include a P type semiconductor layer, but the embodiment is not limited thereto. In addition, a semiconductor layer, such as an N type semiconductor layer (not shown) having polarity opposite to that of the second conductive semiconductor layer 116, can be formed on the second conductive semiconductor layer 116. Thus, the light emitting structure 110 may include one of an N-P junction structure, a P-N junction structure, an N-P-N junction structure, and a P-N-P junction structure.

Thereafter, a second electrode layer 120 may be formed on the second conductive semiconductor layer 116.

The second electrode layer 120 may include an ohmic layer (not shown), a reflective layer (not shown), an adhesive layer (not shown), and a conductive support substrate (not shown).

For example, the second electrode layer 120 may include an ohmic layer, and the ohmic layer makes ohmic contact with the light emitting structure 110 to smoothly supply power to the light emitting structure 110. In addition, the second electrode layer 120 may be formed by stacking single metal, or metal alloy, and metal oxide in a multiple layer.

For example, the ohmic layer may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

In addition, the second electrode layer 120 may include a reflective layer to reflect light incident from the light emitting structure 110, so that light extraction efficiency can be improved.

For example, the reflective layer may include metal including at least one of Ag, Ni, Al, Rh, Pd, Ir, Ru, Mg, Zn, Pt, Au, and Hf, or the alloy thereof. In addition, the reflective layer may be formed in a multiple structure by using the metal or the alloy, and transmissive conductive material such as IZO, IZTO, IAZO, IGZO, IGTO, AZO, or ATO. For example, the reflective layer may have a stack structure of IZO/Ni, AZO/Ag, IZO/Ag/Ni, or AZO/Ag/Ni.

In addition, if the second electrode layer 120 includes an adhesive layer, the reflective layer may serve as the adhesive layer, or may include barrier metal or bonding metal. For example, the adhesive layer may include at least one of Ti, Au, Sn, Ni, Cr, Ga, In, Bi, Cu, Ag, and Ta.

In addition, the second electrode layer 120 may include a conductive support substrate. The conductive support substrate supports the light emitting structure 110 while supplying power to the light emitting structure 110. The conductive support substrate (not shown) may include metal, metal alloy, or conductive semiconductor material having superior electric conductivity.

For example, the conductive support substrate may include at least one selected from the group consisting of Cu, Cu alloy, Au, Ni, Mo, Cu—W, and a carrier wafer (including Si, Ge, GaAs, GaN, ZnO, SiGe, or SiC).

The conductive support substrate may have a thickness varying according to the design of the light emitting device. For example, the conductive support substrate may have a thickness in the range of about 30 μm to about 500 μm.

The conductive support substrate may be formed through an electrochemical metal deposition scheme, a plating scheme, or a bonding scheme using eutectic metal.

The first substrate is removed to expose the first conductive semiconductor layer 112. In order to remove the first substrate, an LLO (Laser Lift Off) scheme or a CLO (Chemical Lift Off) scheme may be used. In addition, the first substrate may be physically ground to be removed.

The light emitting device chip 100 may be attached to the sub-mount 210 by using a polymer adhesive or eutectic metal plated on the light emitting device chip.

For example, the light emitting device chip 100 may be attached to the sub-mount 210 through soldering based on Ag conductive epoxy having a superior process property. If high thermal conductivity is required, the attachment may be achieved by using the eutectic bonding scheme.

In addition, the light emitting device chip 100 may be electrically connected to the first electrode layer and/or the second electrode layer through a wire (not shown).

Next, the encapsulant 250 may be filled in the cavity C as shown in FIG. 4.

The encapsulation of the encapsulant 250 may be performed through a dispensing scheme, a casting molding scheme, a transfer molding scheme, or a vacuum printing scheme.

The encapsulant 250 may include epoxy encapsulant or silicon encapsulant, but the embodiment is not limited thereto.

The encapsulant 250 may have a refractive index different from that of the dielectric pattern 240. For example, the encapsulant 250 may have a refractive index greater than or less than that of the dielectric pattern 240. As the difference in the refractive index between the encapsulant 250 and the dielectric pattern 240 is increased, the diffusion of light at the dielectric pattern 240 is increased. Therefore, the probability, in which light is re-introduced due to the total reflection occurring at the boundary surface between the air and the encapsulant 250, can be lowered, so that final light extraction efficiency can be improved.

For example, if the encapsulant 250 includes a silicon (Si) gel, the dielectric pattern 240 may have the refractive index of about 1.4 or less, or may have the refractive index of about 1.4 or more, but the embodiment is not limited thereto.

The encapsulant 250 may include luminescence material, but the embodiment is not limited thereto. For example, although blue, green, and UV light emitting devices do not require luminescence material, a white light emitting device may include an encapsulant containing luminescence material.

If the encapsulant 250 includes luminescence material, the luminescence material may include host and active materials. For example, Ce active material may be used with respect to host material of Yttrium Aluminum Garnet (YAG), and europium (Eu) active material may be used with respect to silicate-based host material, but the embodiment is not limited thereto.

According to the embodiment, the top surface of the encapsulant 250 may have a dome shape as well as a flat shape.

According to the light emitting device package according to the embodiment, the reflective layer 220 including the dielectric pattern 240 is introduced into the LED package, so that the reflective layer 220 can diffuse light while maintaining the intrinsic refractive thereof. Accordingly, the probability, in which light is re-introduced due to the total reflection occurring at the boundary surface between the air and the encapsulant 250, can be lowered, so that final light extraction efficiency can be improved.

FIG. 6 is a sectional view showing the light emitting device package 202 according to the second embodiment.

The second embodiment may employ the technical features of the first embodiment.

According to the second embodiment, the light emitting device package 202 includes the second dielectric layer 230 formed on the reflective layer 220 and the dielectric pattern 240 may be formed on the second dielectric layer 230, so that the diffraction of the light of the dielectric pattern 240 can be increased and the reflective layer 220 can be prevented from being oxidized.

For example, after forming the second dielectric layer 230 on the reflective layer 220, the dielectric pattern 240 may be formed on the second dielectric layer 230 through an etching process or a lift off process.

The second dielectric layer 230 may include material identical to or different from that of the dielectric pattern 240. If the second dielectric layer 230 includes material different from that of the dielectric pattern 240, the light diffraction of the dielectric pattern 240 may be increased due to the difference in the refractive index between the second dielectric layer 230 and the dielectric pattern 240.

Figure 7:
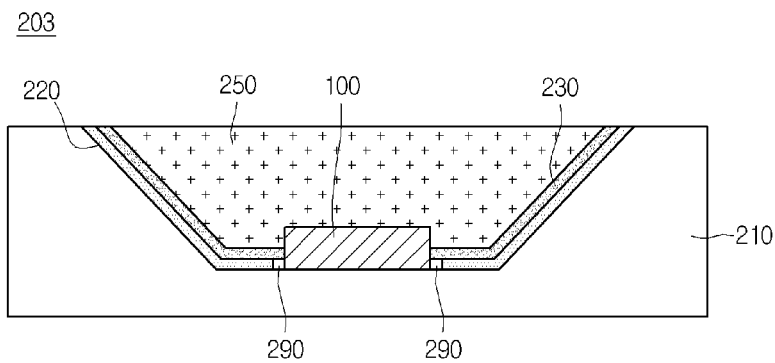
FIG. 7 is a sectional view showing a light emitting device package according to a third embodiment.

FIG. 7 is a sectional view showing a light emitting device package 203 according to a third embodiment.

The third embodiment may employ the technical features of the first or second embodiment.

The light emitting device package 203 according to the third embodiment includes the sub-mount 210 containing the cavity C, the light emitting device chip 100 formed on the sub-mount 210, the reflective layer 220 formed on a lateral surface of the cavity C, the dielectric layer 230 formed on the reflective layer 220, and the encapsulant 250 filled in the cavity C.

In the light emitting device package 203 according to the third embodiment, the second dielectric layer 230 may be formed on the reflective layer 220.

The second dielectric layer 230 may have a refractive index different from that of the encapsulant 250.

The second dielectric layer 230 may include at least one of oxide, nitride, and fluoride.

According to the light emitting device package according to the third embodiment, the reflective layer 220 including the dielectric layer 130 is introduced into the LED package, so that the reflective layer 220 can diffuse light while maintaining the intrinsic refractive thereof. Accordingly, the probability, in which light is re-introduced due to the total reflection occurring at the boundary surface between the air and the encapsulant 250, can be lowered so that final light extraction efficiency can be improved.

Figure 8:
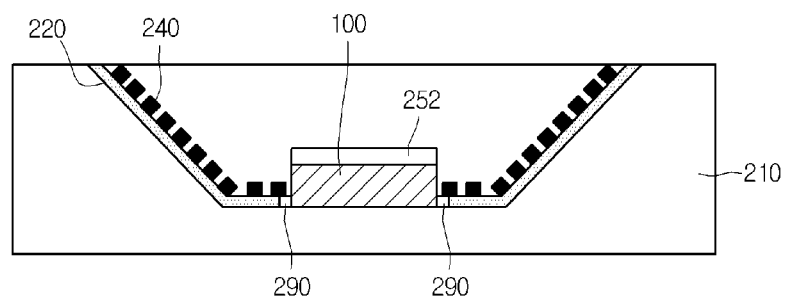
FIG. 8 is a sectional view showing a light emitting device package according to a fourth embodiment.

FIG. 8 is a sectional view showing a light emitting device package 204 according to a fourth embodiment.

The fourth embodiment may employ the technical features of the first to third second embodiments.

In the light emitting device package 204 according to the fourth embodiment, a luminescence material layer 252 may be formed on the light emitting device chip 100 in the chip process before the package process is performed. For example, the light emitting device chip 100 may be provided thereon with the luminescence material layer 252 having a uniform thickness through a conformal coating process. The light emitting device chip 100 having the luminescence material layer 252 may be attached to the sub-mount 210 through the package process, but the embodiment is not limited thereto.

According to the light emitting device package and the method of manufacturing the same according to the embodiment, the reflective layer 220 including the dielectric pattern 240 and/or the dielectric layer 230 is introduced into the LED package, so that the reflective layer 220 can diffuse light while maintaining the intrinsic refractive thereof. Accordingly, the probability, in which light is re-introduced due to the total reflection occurring at the boundary surface between the air and the encapsulant 250, can be lowered so that final light extraction efficiency can be improved.

According to another embodiment, the light emitting device package according to the first to fourth embodiments may constitute lighting appliance. For example, the light emitting device package is applicable to a lighting system such as an LED lamp, an LED street lamp, and an LED optical device.

For example, a plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 9:
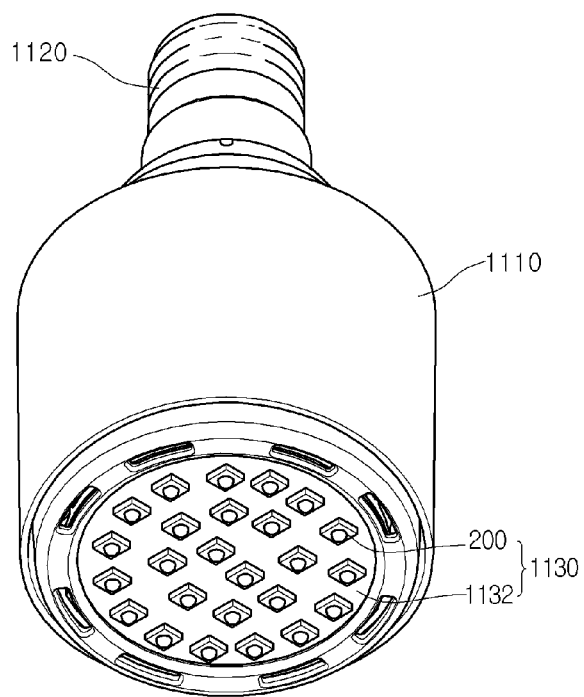
FIG. 9 is a perspective view showing a lighting unit according to the embodiment.

FIG. 9 is a perspective view showing a lighting unit 1100 including the light emitting device or the light emitting device package according to the embodiment. The lighting unit 1100 shown in FIG. 9 is an example of a lighting system and the embodiment is not limited thereto.

Referring to FIG. 9, the lighting unit 1100 includes a case body 1110, a light emitting module 1130 installed in the case body 1110, and a connection terminal 1120 installed in the case body 1110 to receive power from an external power source.

Preferably, the case body 1110 includes material having superior heat dissipation property. For instance, the case body 1110 includes a metallic material or a resin material.

The light emitting module 1130 may include a substrate 1132 and at least one light emitting device package 200 installed on the substrate 1132.

The substrate 1132 includes an insulating member printed with a circuit pattern. For instance, the substrate 700 includes a PCB (printed circuit board), an MC (metal core) PCB, a flexible PCB, or a ceramic PCB.

In addition, the substrate 1132 may include material that effectively reflects the light. The surface of the substrate 1132 can be coated with a color, such as a white color or a silver color, to effectively reflect the light.

At least one light emitting device package 200 according to the embodiment can be installed on the substrate 1132. Each light emitting device package 200 may include at least one LED (light emitting diode). The LED may include a colored LED that emits the light having the color of red, green, blue or white and a UV (ultraviolet) LED that emits UV light.

The LEDs of the light emitting module 1130 can be variously combined to provide various colors and brightness. For instance, the white LED, the red LED and the green LED can be combined to achieve the high color rendering index (CRI).

The connection terminal 1120 is electrically connected to the light emitting module 1130 to supply power to the light emitting module 1130. Referring to FIG. 9, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 10:
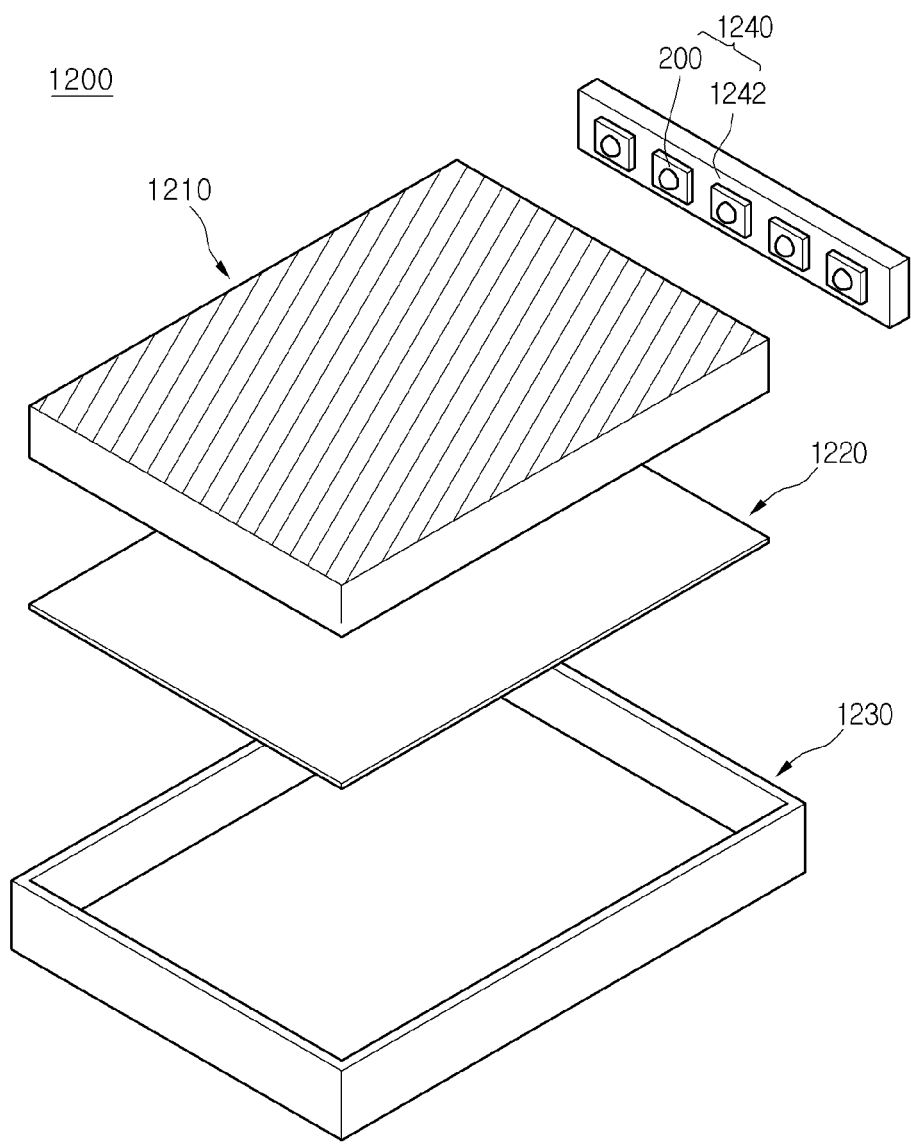
FIG. 10 is an exploded perspective view showing a backlight unit according to the embodiment.

FIG. 10 is an exploded perspective view showing a backlight unit 1200 according to the embodiment. The backlight unit 1200 of FIG. 10 is an example of a lighting system, but the embodiment is not limited thereto.

The backlight unit 1200 according to the embodiment includes a light guide plate 1210, a light emitting module 1240 for providing the light to the light guide plate 1210, a reflective member 1220 positioned below the light guide plate 2110, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 may be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device package 200 is arranged on the substrate 1242 such that light exit surfaces of the light emitting device packages 200 are spaced apart from the light guide plate 1210 by a predetermined distance.

The reflective member 1220 is disposed below the light guide plate 1210. The reflective member 1220 reflects the light, which is traveled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

According to the light emitting device package and the lighting system according to the embodiment, the reflective layer including the dielectric pattern and/or the dielectric layer is introduced into the LED package, so that the reflective layer can diffuse light while maintaining the intrinsic refractive thereof. Accordingly, the probability, in which light is re-introduced due to the total reflection occurring at the boundary surface between the air and the encapsulant, can be lowered so that final light extraction efficiency can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
    a sub-mount including a cavity;
    a light emitting device chip provided in the cavity;
    an electrode electrically connected to the light emitting chip;
    a reflective layer on the cavity;
    a plurality of dielectric patterns disposed on the reflective layer;
    a second dielectric layer on the reflective layer; and
    an encapsulant in the cavity,
    wherein the plurality of dielectric patterns is laterally disposed on a top surface of the reflective layer,
    wherein each of the plurality of dielectric patterns is laterally spaced apart from every other dielectric pattern,
    wherein the plurality of dielectric patterns comprises at least one of oxide, nitride and fluoride,
    wherein the plurality of dielectric patterns is each formed of a same material,
    wherein the plurality of dielectric patterns is formed of a material different than the encapsulant
    wherein the plurality of dielectric patterns is directly disposed on the second dielectric layer, and
    wherein the second dielectric layer is inter-disposed between the reflective layer and the plurality of dielectric patterns.

2. The light emitting device package of claim 1, wherein the plurality of dielectric patterns have a refractive index different than a refractive index of the encapsulant.

3. The light emitting device package of claim 1, wherein each of the plurality of dielectric patterns is spaced from other dielectric patterns by a distance in a range of 50 nm to 3,000 nm.

4. The light emitting device package of claim 1, wherein the encapsulant comprises luminescence material.

5. The light emitting device package of claim 1, wherein the light emitting device chip is provided thereon with a luminescence layer having a uniform thickness.

* * * * *